(12) United States Patent
Murayama et al.

(10) Patent No.: US 8,169,073 B2
(45) Date of Patent: May 1, 2012

(54) SEMICONDUCTOR DEVICE AND ELECTRONIC APPARATUS OF MULTI-CHIP PACKAGING

(75) Inventors: Kei Murayama, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 240 days.

(21) Appl. No.: 11/457,026

(22) Filed: Jul. 12, 2006

(65) Prior Publication Data

US 2007/0013064 A1 Jan. 18, 2007

(30) Foreign Application Priority Data

Jul. 15, 2005 (JP) .................. 2005-206887

(51) Int. Cl.
*H01L 23/34* (2006.01)
(52) U.S. Cl. ........ 257/723; 257/778; 257/787; 257/783; 257/737; 257/E23.01
(58) Field of Classification Search .................. 257/723, 257/E23.01
See application file for complete search history.

(56) References Cited

U.S. PATENT DOCUMENTS

| 4,761,881 A * | 8/1988 | Bora et al. ................... 29/840 |
| 5,414,928 A * | 5/1995 | Bonitz et al. ................ 29/840 |
| 5,586,006 A * | 12/1996 | Seyama et al. .............. 361/719 |
| 6,437,990 B1 * | 8/2002 | Degani et al. ............... 361/783 |
| 2003/0227066 A1 | 12/2003 | Rumer et al. |
| 2004/0043534 A1 | 3/2004 | Yamashita |
| 2004/0053442 A1 | 3/2004 | Akram et al. |
| 2005/0082692 A1 * | 4/2005 | Park et al. .................... 257/796 |
| 2005/0093152 A1 * | 5/2005 | Fjelstad et al. .............. 257/738 |

FOREIGN PATENT DOCUMENTS

| DE | 10348620 | 6/2005 |
| EP | 1067603 | 1/2001 |
| JP | 2001-094033 | 4/2001 |
| JP | 2002-368027 | 12/2002 |
| JP | 2003-203943 | 7/2003 |
| JP | 2005-39161 | 2/2005 |

* cited by examiner

*Primary Examiner* — Lynne Gurley
*Assistant Examiner* — Hsin-Yi Hsieh
(74) *Attorney, Agent, or Firm* — Rankin, Hill & Clark LLP

(57) ABSTRACT

External connection terminals 27 which are electrically connected to semiconductor chips 11-1, 11-2, 12-1, 12-2 and also protrude beyond the semiconductor chips 11-1, 11-2, 12-1, 12-2 are disposed on a substrate 13 of the side to which the plural semiconductor chips 11-1, 11-2, 12-1, 12-2 are connected.

2 Claims, 19 Drawing Sheets

SEMICONDUCTOR DEVICE AND ELECTRONIC APPARATUS OF MULTI-CHIP PACKAGING

TECHNICAL FIELD

The present disclosure relates to a semiconductor device and an electronic apparatus, and particularly to a semiconductor device in which plural semiconductor chips are connected on the same substrate, and an electronic apparatus.

RELATED ART

In the related art, system LSI in which memory or an ASIC, etc. are mixed and installed in one semiconductor chip has been developed as miniaturization of a semiconductor device in which a semiconductor chip is installed on a substrate. However, there were problems that the system LSI requires time in a development period or an increase in manufacturing cost.

Therefore, there is a semiconductor device for achieving miniaturization by closely connecting plural semiconductor chips (for example, memory or an ASIC) with different functions on the same substrate (see FIG. 19).

FIG. 19 is a sectional view of an electronic apparatus comprising a semiconductor device in which plural semiconductor chips with different functions are closely connected on the same substrate.

An electronic apparatus 100 has a semiconductor device 101, a mounting substrate 102 and a sealing resin 115 as shown in FIG. 19. The semiconductor device 101 has a substrate 103 and semiconductor chips 104A, 104B.

The substrate 103 has a base material 105, connection pads 106, 107, wirings 108, 116 and a protective film 109. The connection pads 106, 107 and the wirings 108, 116 are disposed on an upper surface 105A of the base material 105. The connection pads 106 are electrically connected to the semiconductor chips 104A, 104B. The connection pads 107 are electrically connected to the mounting substrate 102.

The wiring 108 makes electrical connection between the connection pads 106 located in the vicinity of the center of the base material 105. The wiring 116 makes electrical connection between the connection pads 106 and the connection pads 107. The protective film 109 is disposed so as to cover the wirings 108, 116 with the connection pads 106, 107 exposed.

The semiconductor chips 104A, 104B are semiconductor chips with different functions and are chips of, for example, memory or an ASIC. The semiconductor chips 104A, 104B are electrically connected to the connection pads 106 disposed on the substrate 103. An under fill resin 110 for reducing a difference in a thermal expansion coefficient is disposed between the semiconductor chips 104A, 104B and the substrate 103.

The semiconductor device 101 configured as described above is attached to the mounting substrate 102 by an adhesive 111. Also, the connection pads 107 and connection pads 113 disposed on the mounting substrate 102 are connected by wires 114 (wire bonding connection). Also, the semiconductor device 101 connected by wire bonding is sealed by the sealing resin 115 for protecting the wires 114 (for example, see Japanese Patent Unexamined Publication No. 2005-39161).

However, in the related-art semiconductor device 101, there was a problem that the connection pads 107 are covered with the under fill resin 110 and electrical connection between the semiconductor device 101 and the mounting substrate 102 cannot be made.

Also, when the connection pads 107 are placed in a position separated from the semiconductor chips 104A, 104B so that the connection pads 107 are not covered with the under fill resin 110, there was a problem that a size (area) of the substrate 103 increases and the semiconductor device 101 cannot be miniaturized.

Further, it is necessary to dispose the connection pads 113 in a position separated from the connection pads 107 so that the wires 114 can be placed in order to electrically connect the connection pads 107 to the connection pads 113 by the wires 114. As a result of that, there was a problem that a size (area) of the mounting substrate 102 increases and the electronic apparatus 100 cannot be miniaturized.

Also, when heights of the wires 114 are higher than those of the semiconductor chips 104A, 104B (when the wires 114 protrude from the semiconductor chips 104A, 104B), the sealing resin 115 becomes thick, so that there was a problem that a height H of the electronic apparatus 100 increases and the electronic apparatus 100 cannot be miniaturized.

SUMMARY

Embodiments of the present invention provide a semiconductor device and an electronic apparatus capable of achieving miniaturization and improving reliability of electrical connection between the semiconductor device and a mounting substrate.

According to one aspect of one or more embodiments of the invention, there is provided a semiconductor device comprising plural semiconductor chips and a substrate having an external connection terminal electrically connected to the plural semiconductor chips, characterized in that the external connection terminal is disposed on the substrate of the side to which the plural semiconductor chips are connected and also is protruded beyond the plural semiconductor chips.

According to the invention, by disposing an external connection terminal on a substrate of the side to which plural semiconductor chips are connected and also protruding the external connection terminal beyond the plural semiconductor chips, for example, when an under fill resin is disposed between the plural semiconductor chips and the substrate, a connection portion (portion electrically connected to a mounting substrate etc.) of the external connection terminal is prevented from being covered with the under fill resin, so that reliability of electrical connection to a semiconductor device can be improved. Also, the external connection terminal is placed closer to the plural semiconductor chips than ever before and an area of the substrate is decreased and the semiconductor device can be miniaturized.

Also, an under fill resin is disposed between the plural semiconductor chips and the substrate, and a part of the external connection terminal located in the side of the substrate may be covered with the under fill resin. By covering a part of the external connection terminal located in the side of the substrate with the under fill resin thus, the external connection terminal can be reinforced.

Further, the plural semiconductor chips are semiconductor chips with different functions and may be placed mutually closely. By mutually closely placing the plural semiconductor chips with different functions thus, the plural semiconductor chips can achieve a function near to system LSI.

According to another aspect of one or more embodiments of the invention, there is provided an electronic apparatus comprising a semiconductor device, and a mounting substrate having a first connection pad opposed to the external connection terminal, characterized in that the external connection terminal is electrically connected to the first connection pad.

According to the invention, by disposing a first connection pad on a mounting substrate as opposed to an external connection terminal, an area of the mounting substrate is decreased and an electronic apparatus can be miniaturized. Also, the need for a sealing resin which was required in the related-art electronic apparatus for making wire bonding connection between the semiconductor device and the mounting substrate is eliminated, so that a height of the electronic apparatus can be decreased. Further, the need for the sealing resin is eliminated, so that manufacturing cost of the electronic apparatus can be reduced.

Further, the mounting substrate further has a second connection pad, and the plural semiconductor chips comprise a metal layer on a surface opposite to a surface to which the substrate is connected, and the second connection pad may be electrically connected to the metal layer. As a result of this, heat accumulated in the plural semiconductor chips can be radiated efficiently.

Various implementations may include one or more the following advantages. For example, a semiconductor device and an electronic apparatus capable of achieving miniaturization and improving reliability of electrical connection between the semiconductor device and a mounting substrate can be provided.

Other features and advantages may be apparent from the following detailed description, the accompanying drawings and the claims.

DETAILED DESCRIPTION

Next, embodiments of the invention will be described based on the drawings.

(First Embodiment)

Figure 1:
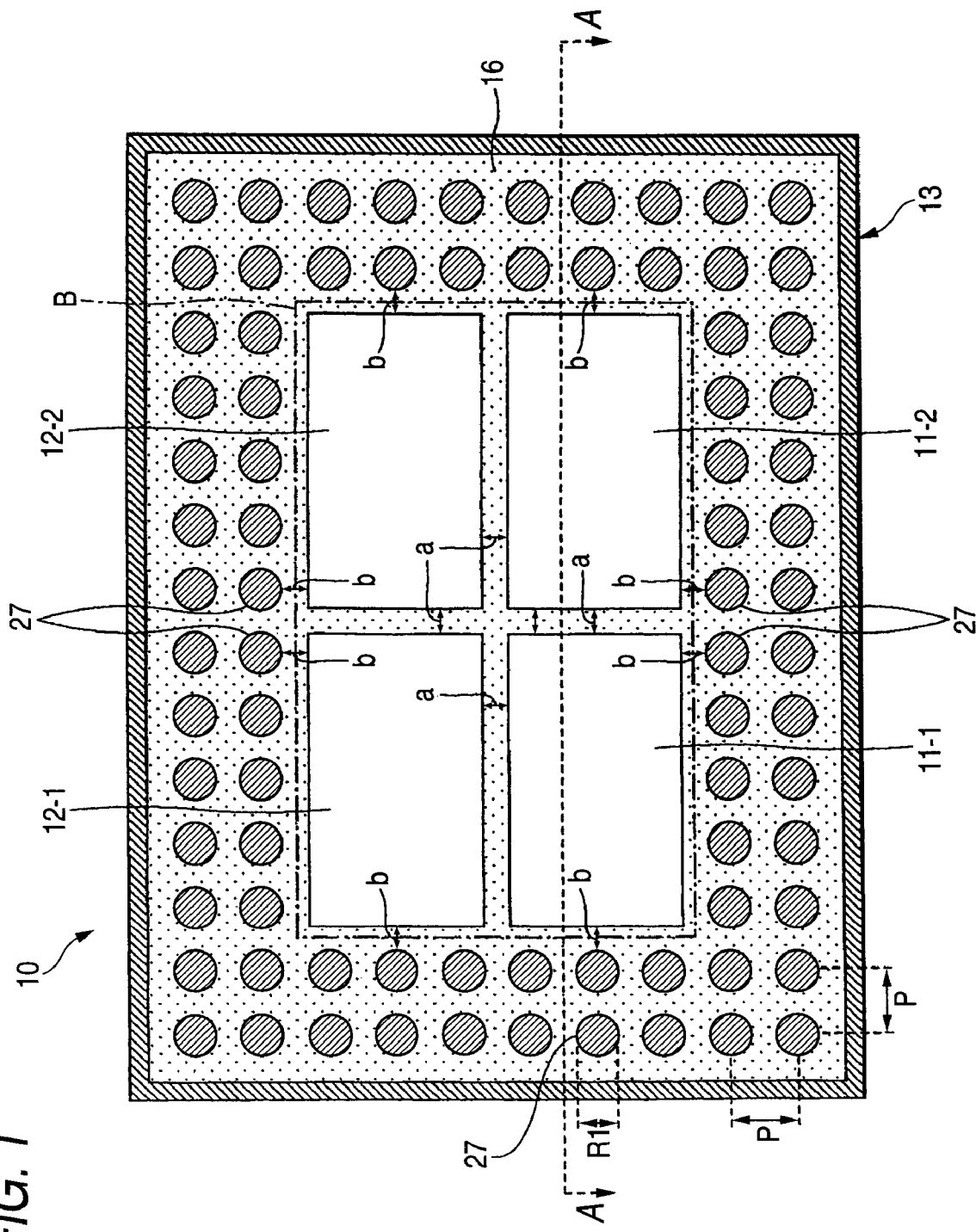
FIG. 1 is a plan view of a semiconductor device according to a first embodiment of the invention.
Figure 2:
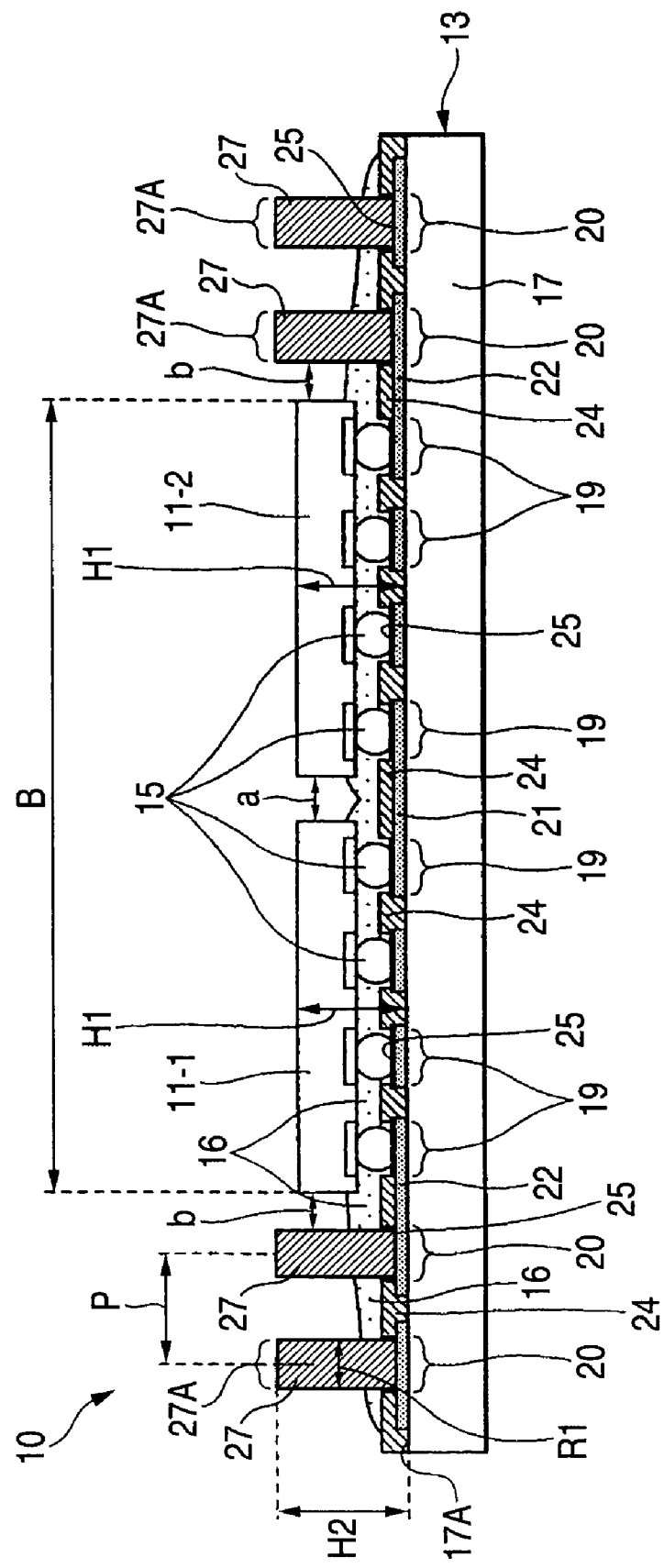
FIG. 2 is a sectional view in a direction of line A-A of the semiconductor device shown in FIG. 1.

FIG. 1 is a plan view of a semiconductor device according to a first embodiment of the invention, and FIG. 2 is a sectional view in a direction of line A-A of the semiconductor device shown in FIG. 1. In FIG. 1, B shows a region (hereinafter called "a mounting region B") on a substrate 13 on which semiconductor chips 11-1, 11-2, 12-1, 12-2 are mounted. Also, in FIG. 2, H1 shows a height (hereinafter called "a height H1") of the semiconductor chips 11-1, 11-2, 12-1, 12-2 in the case of using a surface 17A of a base material 17 as the reference and H2 shows a height (hereinafter called "a height H2") of external connection terminals 27 in the case of using the surface 17A of the base material 17 as the reference, respectively.

Figure 3:
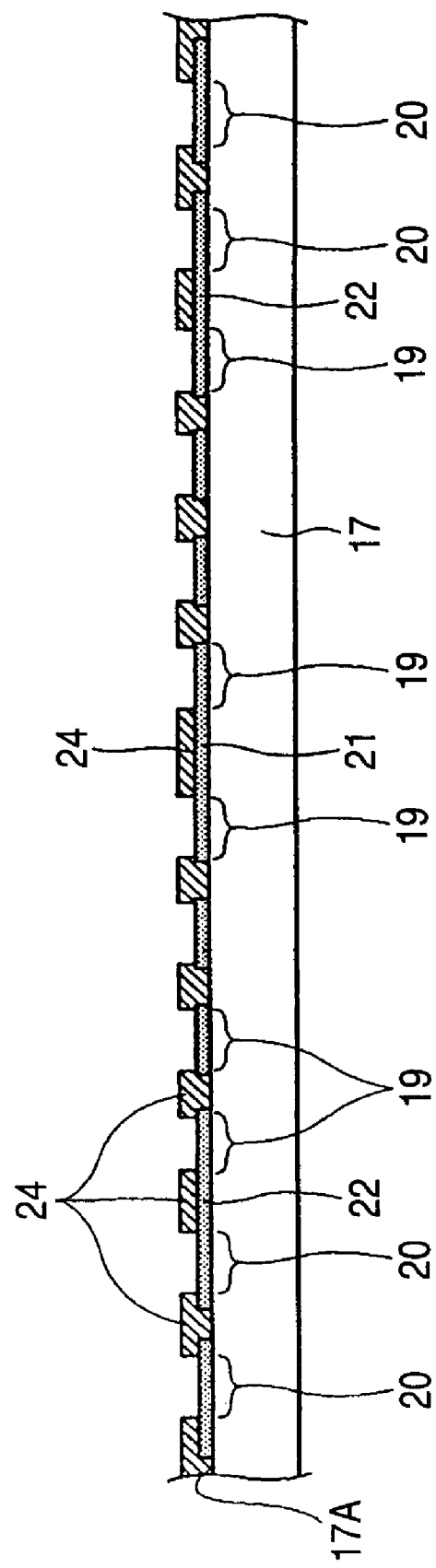
FIG. 3 is a diagram showing a manufacturing step of the semiconductor device according to the first embodiment (first).

Referring to FIGS. 2 and 3, a semiconductor device 10 has plural semiconductor chips 11-1, 11-2, 12-1, 12-2 (four chips in the present embodiment) and the substrate 13.

The semiconductor chips 11-1, 11-2 are semiconductor chips with functions different from those of the semiconductor chips 12-1, 12-2. As the semiconductor chips 11-1, 11-2, for example, a semiconductor chip for memory can be used and in that case, as semiconductor chips 12-1, 12-2, for example, a semiconductor chip for ASIC can be used. Also, as a semiconductor substrate of the semiconductor chips 11-1, 11-2, 12-1, 12-2, for example, a silicon substrate can be used. The case of using the silicon substrate as the semiconductor substrate of the semiconductor chips 11-1, 11-2, 12-1, 12-2 will be described below as an example.

Flip chip connection between the semiconductor chips 11-1, 11-2, 12-1, 12-2 and the substrate 13 is made through solder bumps 15 in a state that the semiconductor chips 11-1, 11-2, 12-1, 12-2 are in a mutually close state.

By connecting the semiconductor chips 11-1, 11-2, 12-1, 12-2 to the substrate 13 in the state that the semiconductor chips 11-1, 11-2, 12-1, 12-2 are in the close state thus, the semiconductor chips 11-1, 11-2, 12-1, 12-2 can achieve a function near to system LSI. A distance a (value indicating the extent of proximity) between the semiconductor chips 11-1, 11-2, 12-1, 12-2 can be set at, for example, 50 μm to 100 μm.

Also, by making flip chip connection of the semiconductor chips 11-1, 11-2, 12-1, 12-2, a height of the semiconductor device 10 can be decreased as compared with the case of making wire bonding connection.

An under fill resin 16 is disposed between the semiconductor chips 11-1, 11-2, 12-1, 12-2 and the substrate 13. The under fill resin 16 is means for reducing a difference between the semiconductor chips 11-1, 11-2, 12-1, 12-2 and the substrate 13 in a thermal expansion coefficient. As the under fill resin 16, for example, an epoxy resin can be used.

The substrate 13 has a base material 17, connection pads 19, 20, wirings 21, 22, a protective film 24, an adhesion layer 25 and the external connection terminals 27. The base material 17 is formed in plate shape. Silicon is preferable as material of the base material 17. A difference between the substrate 13 and the semiconductor chips 11-1, 11-2, 12-1, 12-2 comprising a silicon substrate in a thermal expansion coefficient can be reduced by using silicon as material of the base material 17.

A plurality of the connection pads 19, 20 and the wirings 21, 22 are respectively disposed on the surface 17A of the base material 17. The connection pads 19 are disposed on the base material 17 so as to correspond to the mounting region B of the semiconductor chips 11-1, 11-2, 12-1, 12-2. The connection pads 19 are electrically connected to the semiconductor chips 11-1, 11-2, 12-1, 12-2 through the solder bumps 15.

The connection pads 20 are disposed on the base material 17 so as to surround the mounting region B of the semiconductor chips 11-1, 11-2, 12-1, 12-2. The connection pads 20 are means for arranging the external connection terminals 27, and are electrically connected to the external connection terminals 27 through the adhesion layer 25.

The wiring 21 is disposed in the vicinity of the center of the base material 17. The wiring 21 makes electrical connection between the connection pads 19 connected to the semiconductor chip 11-1 and the connection pads 19 connected to the semiconductor chip 11-2. Electrical connection between the semiconductor chips 11-1, 11-2 is made by this wiring 21. Also, electrical connection between the connection pads 19 connected to the semiconductor chip 12-1 and the connection pads 19 connected to the semiconductor chip 12-2 is made by the wiring 21 (not shown).

The wiring 22 makes electrical connection between the connection pads 19 and the connection pad 20. Electrical connection between the external connection terminals 27 and each of the semiconductor chips 11-1, 11-2, 12-1, 12-2 is made by this wiring 22. As material of the connection pads 19, 20 and the wirings 21, 22, a conductive material can be used and concretely, Al can be used.

The protective film 24 is disposed so as to cover the wirings 21, 22 and the surface 17A of the base material 17 with the connection pads 19, 20 exposed. As material of the protective film 24, for example, a polyimide resin can be used.

The adhesion layer 25 is disposed on the connection pads 19, 20. The adhesion layer 25 disposed on the connection pads 19 is means for improving properties of adhesion between the connection pads 19 and the solder bumps 15. Also, the adhesion layer 25 disposed on the connection pads 20 is means for improving properties of adhesion between the connection pads 20 and the external connection terminals 27. As the adhesion layer 25, for example, a Ti/Cu laminated film in which a Ti film and a Cu film are sequentially laminated from the side of the connection pads 19, 20 can be used.

The external connection terminals 27 are columnar conductive members protruding beyond the semiconductor chips 11-1, 11-2, 12-1, 12-2, and are disposed on the connection pads 20 on which the adhesion layer 25 is formed. The external connection terminals 27 are electrically connected to the semiconductor chips 11-1, 11-2, 12-1, 12-2 through the connection pads 20.

The height H2 of the external connection terminal 27 is set so as to become higher than the height H1 of the semiconductor chips 11-1, 11-2, 12-1, 12-2 (H2>H1). The external connection terminal 27 is a terminal for making connection to a mounting substrate such as a motherboard (not shown).

By disposing the external connection terminals 27 protruding beyond the semiconductor chips 11-1, 11-2, 12-1, 12-2 on the surface 17A of the base material 17 to which plural semiconductor chips 11-1, 11-2, 12-1, 12-2 are connected thus, connection portions 27A (portions electrically connected to a mounting substrate etc.) of the external connection terminals 27 are prevented from being covered with the under fill resin 16, so that reliability of electrical connection between the semiconductor device 10 and a mounting substrate (not shown) can be improved.

Also, the external connection terminals 27 can be disposed closer to the semiconductor chips 11-1, 11-2, 12-1, 12-2 than ever before, so that a size (area) of the substrate 13 is decreased and the semiconductor device 10 can be miniaturized.

Also, a part of the external connection terminal 27 located in the side of the base material 17 is covered with the under fill resin 16. By covering a part of the external connection terminal 27 with the under fill resin 16 thus, the external connection terminal 27 can be reinforced. Also, a position of the external connection terminal 27 on the substrate 13 can be regulated by this reinforcement.

For example, when the height H1 of the semiconductor chips 11-1, 11-2, 12-1, 12-2 is 70 μm, the height H2 of the external connection terminal 27 can be set at 200 μm. Also, a diameter R1 of the external connection terminal 27 can be set at, for example, 200 μm and in this case, an arrangement pitch P of the external connection terminals 27 can be set at, for example, 400 μm. A distance b between each of the semiconductor chips 11-1, 11-2, 12-1, 12-2 and the external connection terminal 27 closest to each of the semiconductor chips 11-1, 11-2, 12-1, 12-2 can be set at, for example, 50 μm to 300 μm, preferably, 50 μm. As material of the external connection terminal 27, a conductive material can be used and concretely, Cu can be used.

According to the semiconductor device of the embodiment, by disposing the external connection terminals 27 protruding beyond the semiconductor chips 11-1, 11-2, 12-1, 12-2 on the surface 17A of the base material 17 to which plural semiconductor chips 11-1, 11-2, 12-1, 12-2 with different functions are connected, the connection portions 27A of the external connection terminals 27 are prevented from being covered with the under fill resin 16, so that the external connection terminals 27 are placed closer to the semiconductor chips 11-1, 11-2, 12-1, 12-2 than ever before and a size (area) of the substrate 13 is decreased and the semiconductor device 10 can be miniaturized.

FIGS. 4 to 10 are diagrams showing manufacturing steps of the semiconductor device according to the first embodiment. In FIGS. 4 to 10, the same numerals are assigned to the same components as those of the semiconductor device 10 described above.

A manufacturing method of the semiconductor device according to the first embodiment will be described with reference to FIGS. 4 to 10. First, in a step of FIG. 3, connection pads 19, 20 and wirings 21, 22 are simultaneously formed on a surface 17A of a base material 17. Next, a protective film 24 is formed so as to cover the wirings 21, 22 and the surface 17A of the base material 17 with the connection pads 19, 20 exposed. Concretely, a silicon wafer having plural substrate formation regions (regions in which a substrate 13 is formed) is used as the base material 17 and an Al film is formed on the surface 17A of the base material 17 by a sputtering method and thereafter, a resist layer patterned is formed on the Al film and subsequently, the Al film is etched by a dry etching method using the resist layer as a mask and the connection pads 19, 20 and the wirings 21, 22 are simultaneously formed. The protective film 24 is formed by, for example, applying a polyimide resin by a screen printing method. In addition, the Al film may be formed using a vapor deposition method or a CVD method other than the sputtering method.

Figure 4:
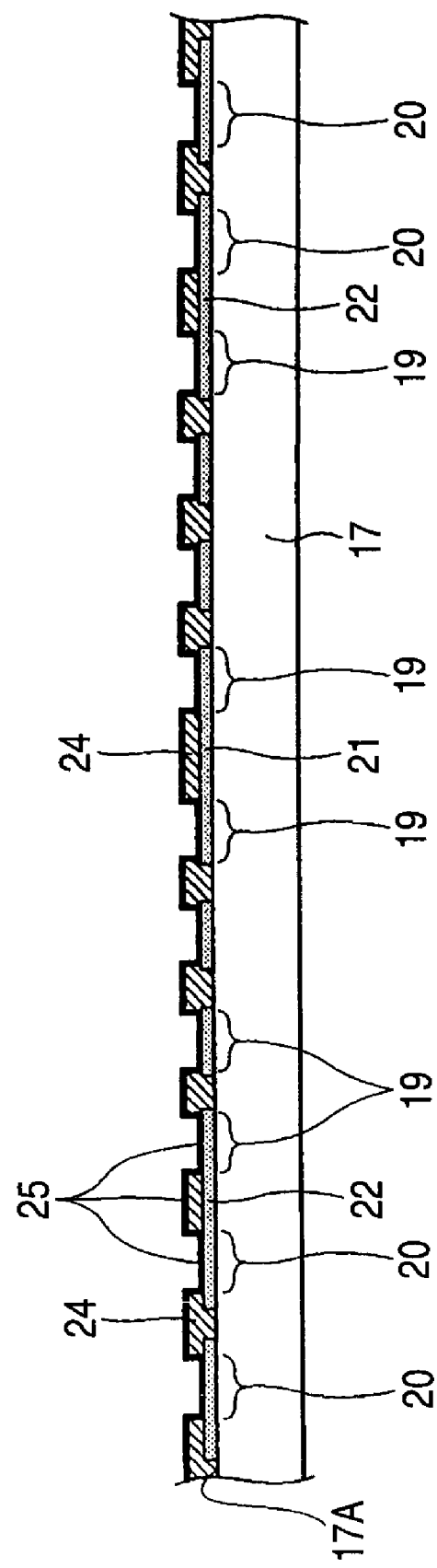
FIG. 4 is a diagram showing a manufacturing step of the semiconductor device according to the first embodiment (second).

Then, in a step of FIG. 4, an adhesion layer 25 is formed so as to cover an upper surface of the structure shown in FIG. 3. As the adhesion layer 25, for example, a Ti/Cu laminated film in which a Ti film and a Cu film are sequentially laminated by a sputtering method can be used. The adhesion layer 25 may be formed by a vapor deposition method or a CVD method, etc. other than the sputtering method.

Figure 5:
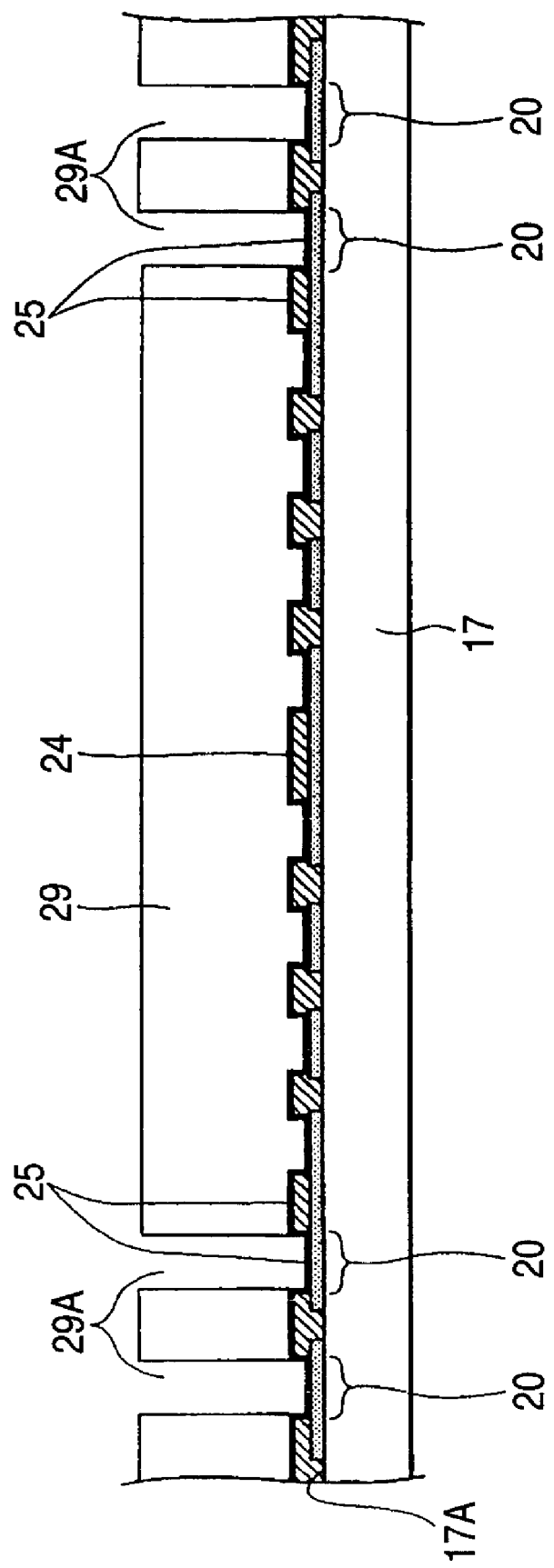
FIG. 5 is a diagram showing a manufacturing step of the semiconductor device according to the first embodiment (third).

Then, in a step of FIG. 5, a resist layer 29 having openings 29A is formed on the structure shown in FIG. 4. The openings 29A are openings for exposing the adhesion layer 25 formed on the connection pads 20.

Figure 6:
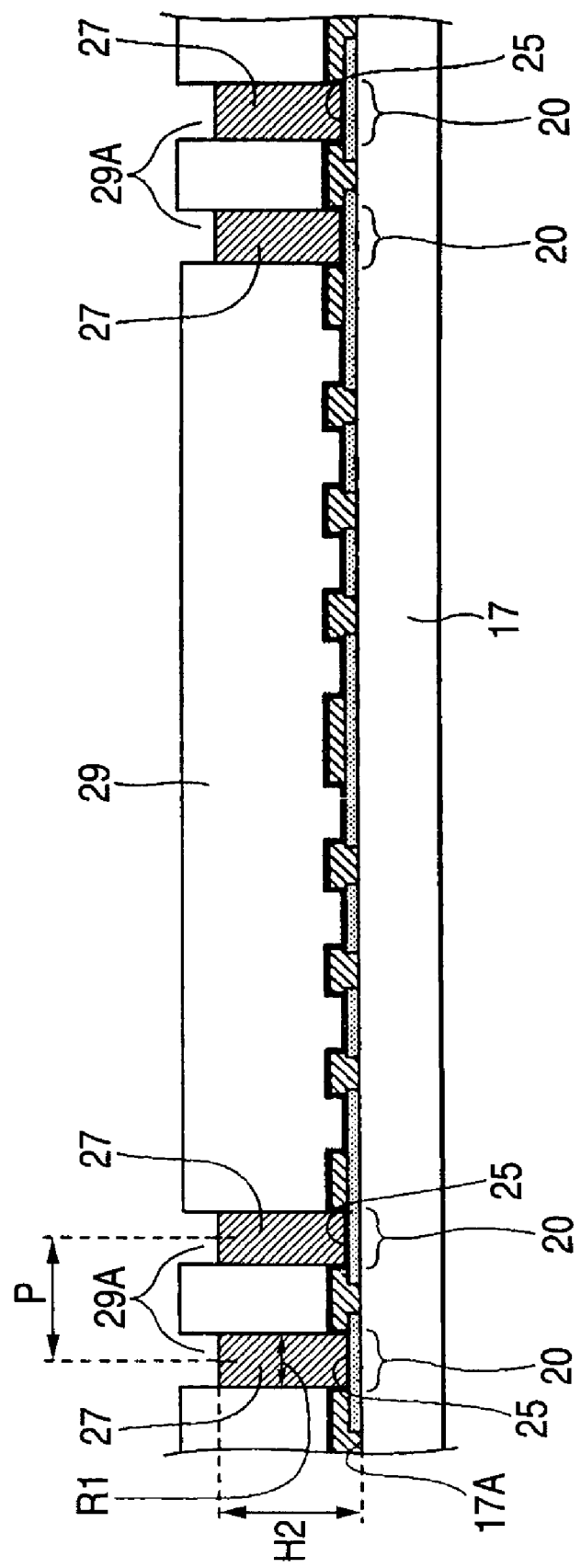
FIG. 6 is a diagram showing a manufacturing step of the semiconductor device according to the first embodiment (fourth).

Then, in a step of FIG. 6, external connection terminals 27 are formed by precipitating a conductive metal film on the adhesion layer 25 exposed to the openings 29A by an electrolytic plating method using the adhesion layer 25 as a power feeding layer. As the conductive metal film, for example, a Cu film can be used. A height H2 of the external connection terminal 27 can be set at, for example, 200 μm. Also, a diameter R1 of the external connection terminal 27 can be set at, for example, 200 μm and in this case, an arrangement pitch P of the external connection terminals 27 can be set at, for example, 400 μm.

Figure 7:
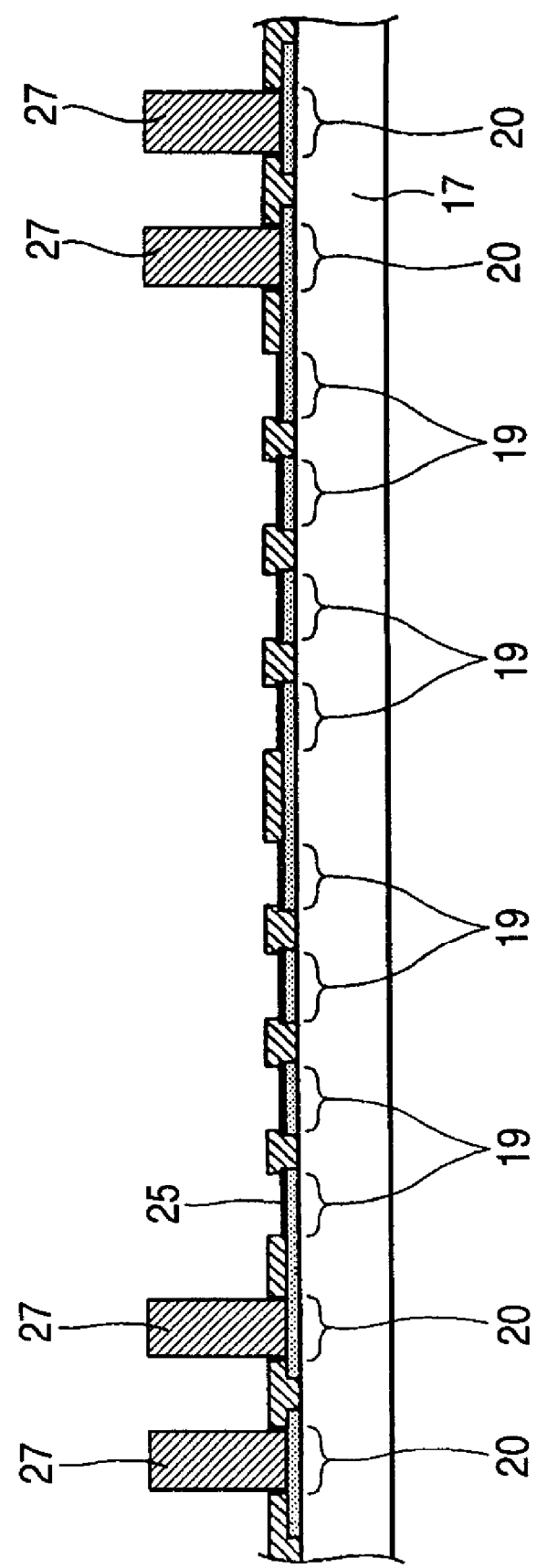
FIG. 7 is a diagram showing a manufacturing step of the semiconductor device according to the first embodiment (fifth).

Then, in a step of FIG. 7, the resist layer 29 is removed and thereafter, the adhesion layer 25 disposed in the portion other than the connection pads 19, 20 is removed. As a result of this, a structure corresponding to the substrate 13 is formed in each of the substrate formation regions on the silicon wafer.

Figure 8:
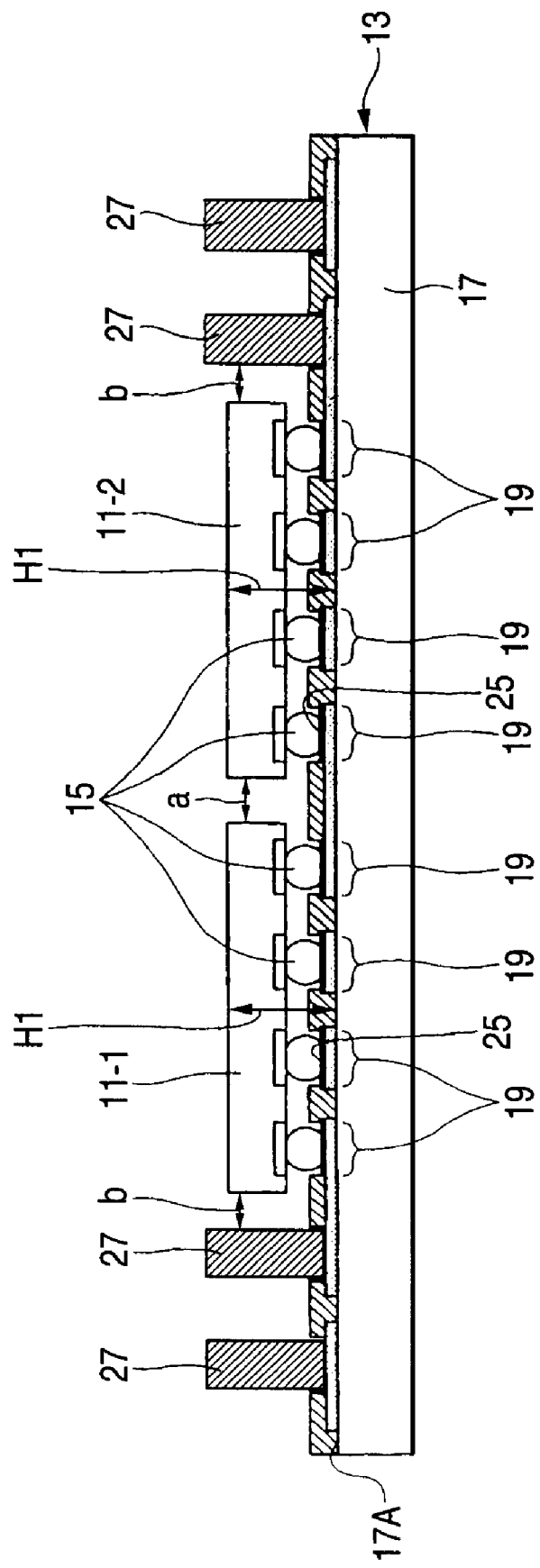
FIG. 8 is a diagram showing a manufacturing step of the semiconductor device according to the first embodiment (sixth).

Then, in a step of FIG. 8, semiconductor chips 11-1, 11-2, 12-1, 12-2 are connected through solder bumps 15 on the connection pads 19 on which the adhesion layer 25 is disposed (flip chip connection). The solder bump 15 is a bump in which solder disposed on each of the semiconductor chips 11-1, 11-2, 12-1, 12-2 and solder disposed on the adhesion layer 25 corresponding to the connection pads 19 are melted. A height H1 of the semiconductor chips 11-1, 11-2, 12-1, 12-2 can be set at, for example, 70 μm. Thereafter, the substrate 13 on which the semiconductor chips 11-1, 11-2, 12-1, 12-2 are mounted is diced by dicing.

Figure 9:
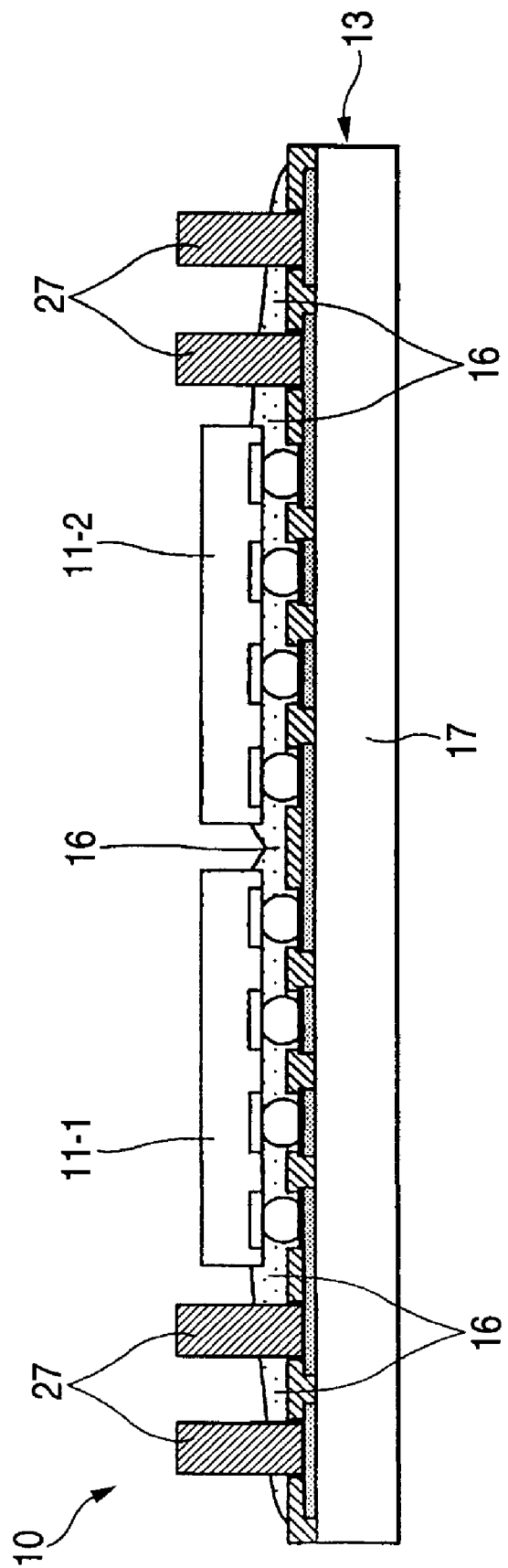
FIG. 9 is a diagram showing a manufacturing step of the semiconductor device according to the first embodiment (seventh).

Then, in a step of FIG. 9, an under fill resin 16 is filled between the semiconductor chips 11-1, 11-2, 12-1, 12-2 and the substrate 13 and also covers parts of the external connection terminals 27. As the under fill resin 16, for example, an epoxy resin can be used. By the manufacturing method described above, the semiconductor device 10 is manufactured.

In this embodiment, the semiconductor device 10 further may be sealed by a sealing resin with the surface 17A of the base material 17 exposed. By sealing the semiconductor device 10 with the sealing resin, the semiconductor device 10 is easy to be handled. Further, a thermal expansion coefficient difference between the whole of the semiconductor device 10 and a mounting substrate (mounting substrate 61 in FIG. 16) of an electronic apparatus can be reduced since the whole thermal expansion coefficient of the semiconductor device 10 sealed by the sealing resin is increased in comparison with the thermal expansion coefficient of the semiconductor device which is not sealed.

Figure 10:
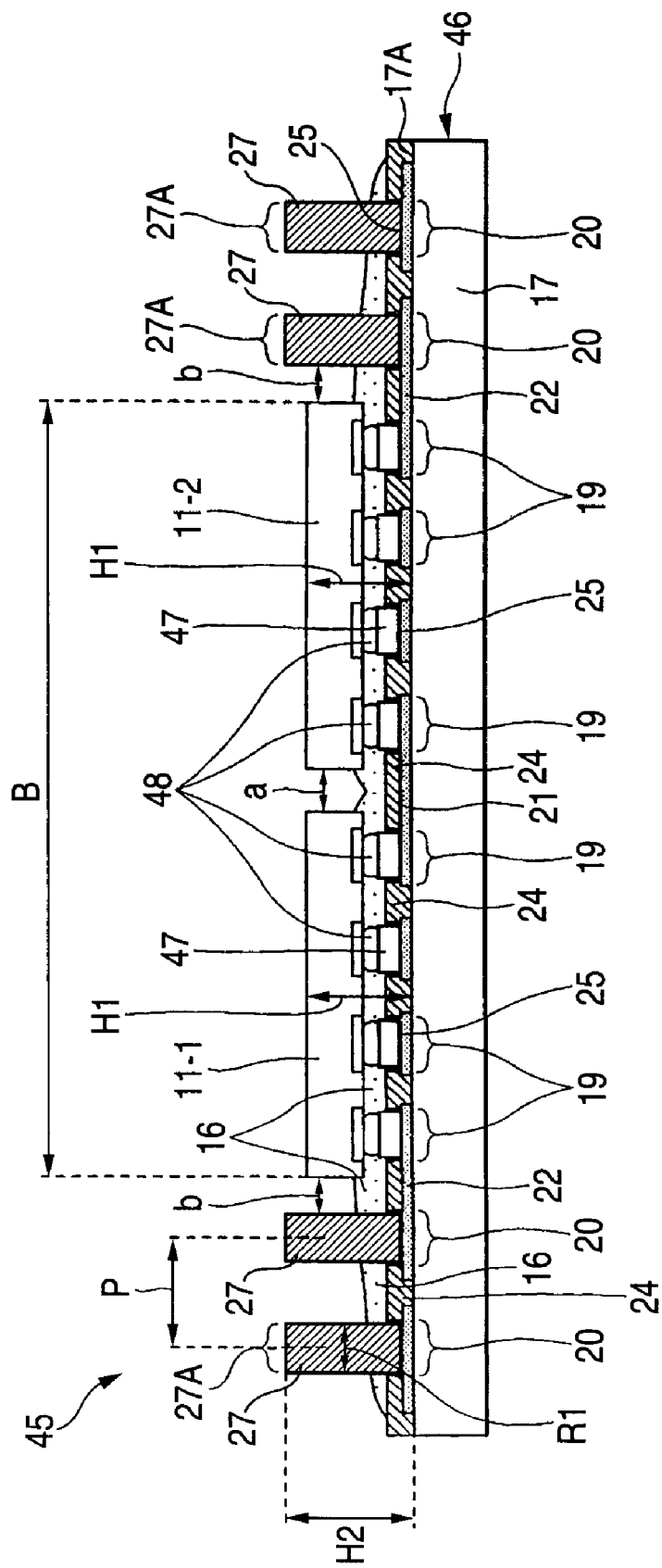
FIG. 10 is a sectional view of a semiconductor device according to a modified example of the embodiment.

FIG. 10 is a sectional view of a semiconductor device according to a modified example of the embodiment. In FIG. 10, the description is omitted by assigning the same numerals to the same components as those of the semiconductor device 10 described in FIGS. 2 and 3.

Referring to FIG. 10, a semiconductor device 45 has semiconductor chips 11-1, 11-2, 12-1, 12-2 and a substrate 46.

The substrate 46 is configured in a manner similar to the substrate 13 except that conductive members 47 are further disposed in the configuration of the substrate 13 described above. The conductive members 47 are disposed on an adhesion layer 25 formed on connection pads 19. The conductive members 47 are electrically connected to the semiconductor chips 11-1, 11-2, 12-1, 12-2 through solder 48. A thickness of the conductive member 47 can be set at, for example, 15 μm to 20 μm. As material of the conductive member 47, material having good adhesion to the solder is preferable and, for example, Cu can be used.

By disposing the conductive members 47 on the adhesion layer 25 formed on the connection pads 19 thus, the amount of solder necessary in the case of connecting the semiconductor chips 11-1, 11-2, 12-1, 12-2 to the substrate 46 is decreased and manufacturing cost of the semiconductor device 45 can be reduced.

In addition, effect similar to that of the semiconductor device 10 described above can also be obtained in the semiconductor device 45 configured above.

FIGS. 12 to 16 are diagrams showing manufacturing steps of the semiconductor device according to the modified example of the embodiment. In FIGS. 12 to 16, the same numerals are assigned to the same components as those of the semiconductor device 45 described above.

Figure 11:
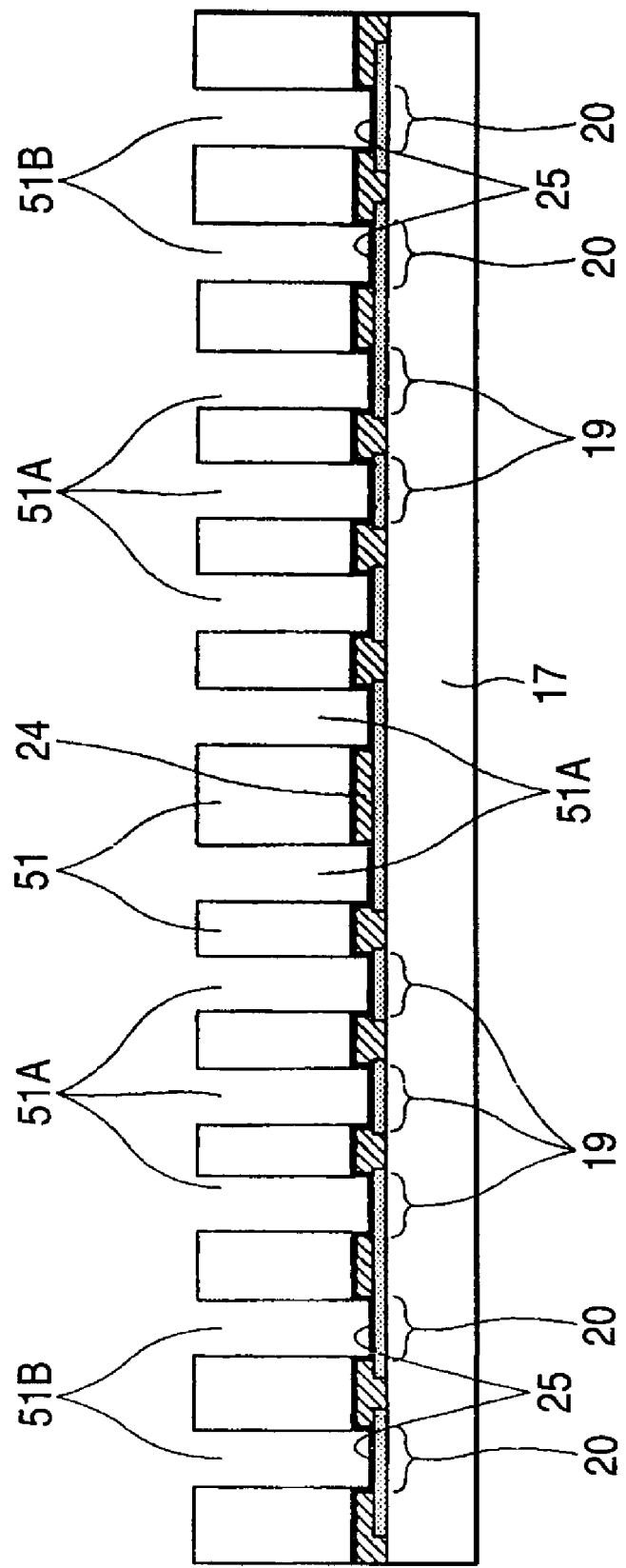
FIG. 11 is a diagram showing a manufacturing step of the semiconductor device according to the modified example of the embodiment (first).

Next, a manufacturing method of the semiconductor device 45 according to the modified example of the embodiment will be described with reference to FIGS. 12 to 16. First, the structure shown in FIG. 4 is formed by the steps of FIGS. 4 and 5 described above. Next, in a step of FIG. 11, a resist layer 51 having openings 51A, 51B is formed on the structure shown in FIG. 4. The openings 51A correspond to formation positions of conductive members 47, and an adhesion layer 25 formed on connection pads 19 is exposed. The openings 51B correspond to formation positions of external connection terminals 27, and the adhesion layer 25 formed on connection pads 20 is exposed.

Figure 12:
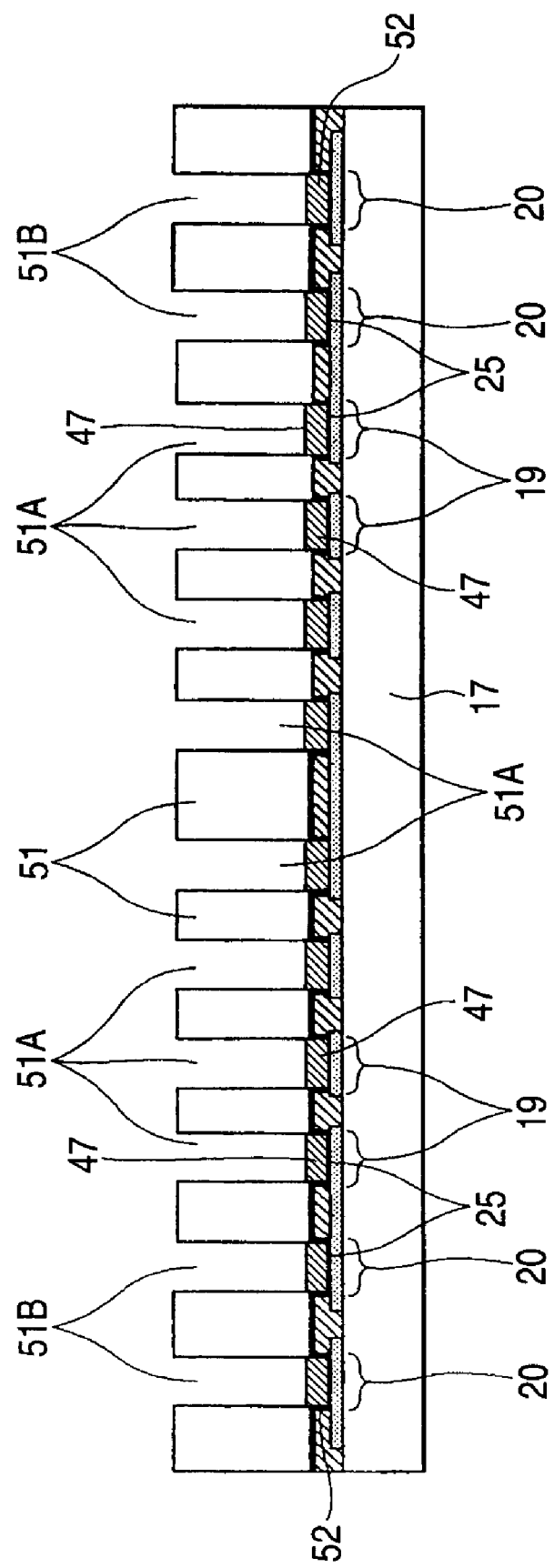
FIG. 12 is a diagram showing a manufacturing step of the semiconductor device according to the modified example of the embodiment (second).

Then, in a step of FIG. 12, the conductive members 47 are formed in the openings 51A by precipitating a conductive metal film 52 on the adhesion layer 25 exposed to the openings 51A, 51B by an electrolytic plating method using the adhesion layer 25 as a power feeding layer. As the conductive metal film 52, for example, a Cu film can be used. Also, a thickness of the conductive metal film 52 can be set at, for example, 15 μm to 20 μm. The resist layer 51 is removed after the conductive members 47 are formed. In addition, in FIG. 12, the conductive metal film 52 formed on the adhesion layer 25 corresponding to the openings 51A is illustrated as the conductive members 47.

Figure 13:
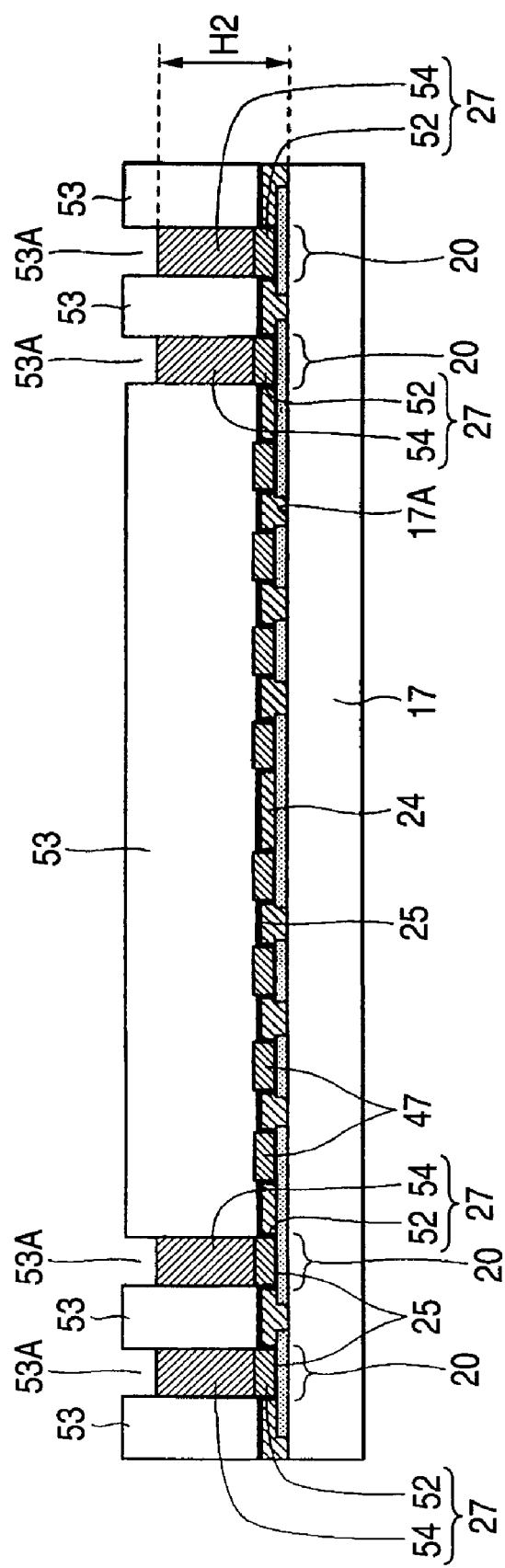
FIG. 13 is a diagram showing a manufacturing step of the semiconductor device according to the modified example of the embodiment (third).

Then, in a step of FIG. 13, a resist layer 53 having openings 53A for exposing the conductive metal film 52 disposed over the connection pads 20 is formed and subsequently, a conductive metal film 54 is formed on the conductive metal film 52 by an electrolytic plating method using the conductive metal film 52 exposed from the openings 53A as a power feeding layer. As a result of this, the external connection terminals 27 made of the conductive metal film 52 and the conductive metal film 54 are formed. Also, a height H2 of the external connection terminal 27 using a surface 17A of a base material 17 as the reference can be set at, for example, 200 µm.

Figure 14:
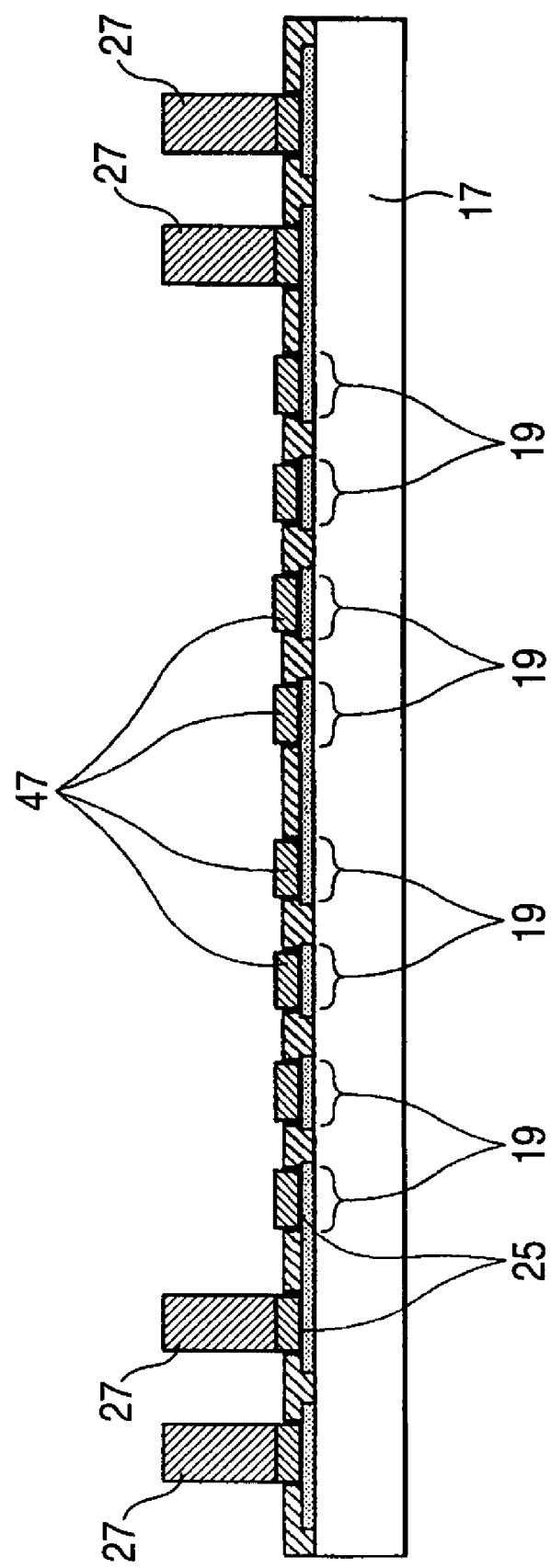
FIG. 14 is a diagram showing a manufacturing step of the semiconductor device according to the modified example of the embodiment (fourth).
Figure 15:
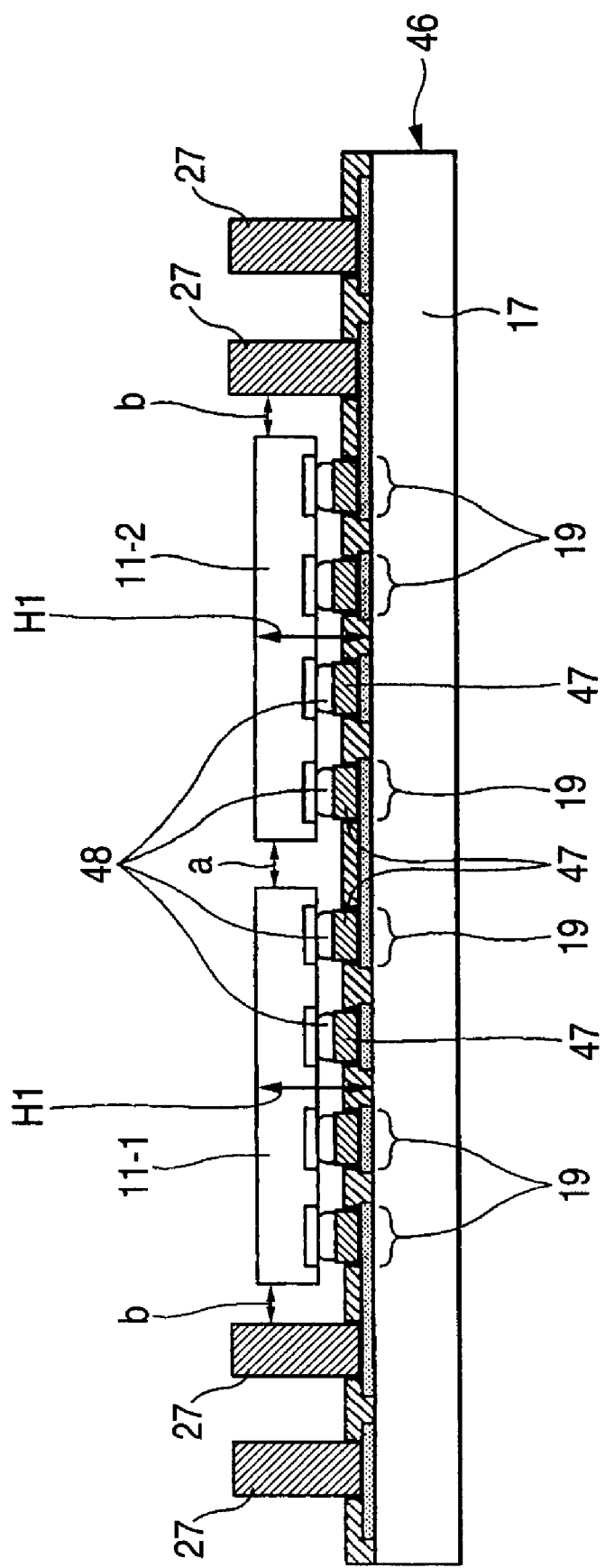
FIG. 15 is a diagram showing a manufacturing step of the semiconductor device according to the modified example of the embodiment (fifth).

Then, in a step of FIG. 14, the resist layer 53 is removed and then, the adhesion layer 25 which is not exposed to the conductive members 47 and the external connection terminals 27 is removed. Then, in a step of FIG. 15, solder 48 is disposed on electrode pads (not shown) of the semiconductor chips 11-1, 11-2, 12-1, 12-2 and this solder 48 is electrically connected to the conductive members 47.

By forming the conductive members 47 on the adhesion layer 25 located over the connection pads 19 thus, the solder 48 is disposed on only the semiconductor chips 11-1, 11-2, 12-1, 12-2 and the semiconductor chips 11-1, 11-2, 12-1, 12-2 can be connected to the substrate 46, so that the amount of solder necessary for connection is decreased and manufacturing cost of the semiconductor device 45 can be reduced.

Then, the substrate 46 to which the semiconductor chips 11-1, 11-2, 12-1, 12-2 are connected is diced by dicing. Thereafter, the semiconductor device 45 is manufactured by performing processing similar to the step of FIG. 9 described above.

Figure 16:
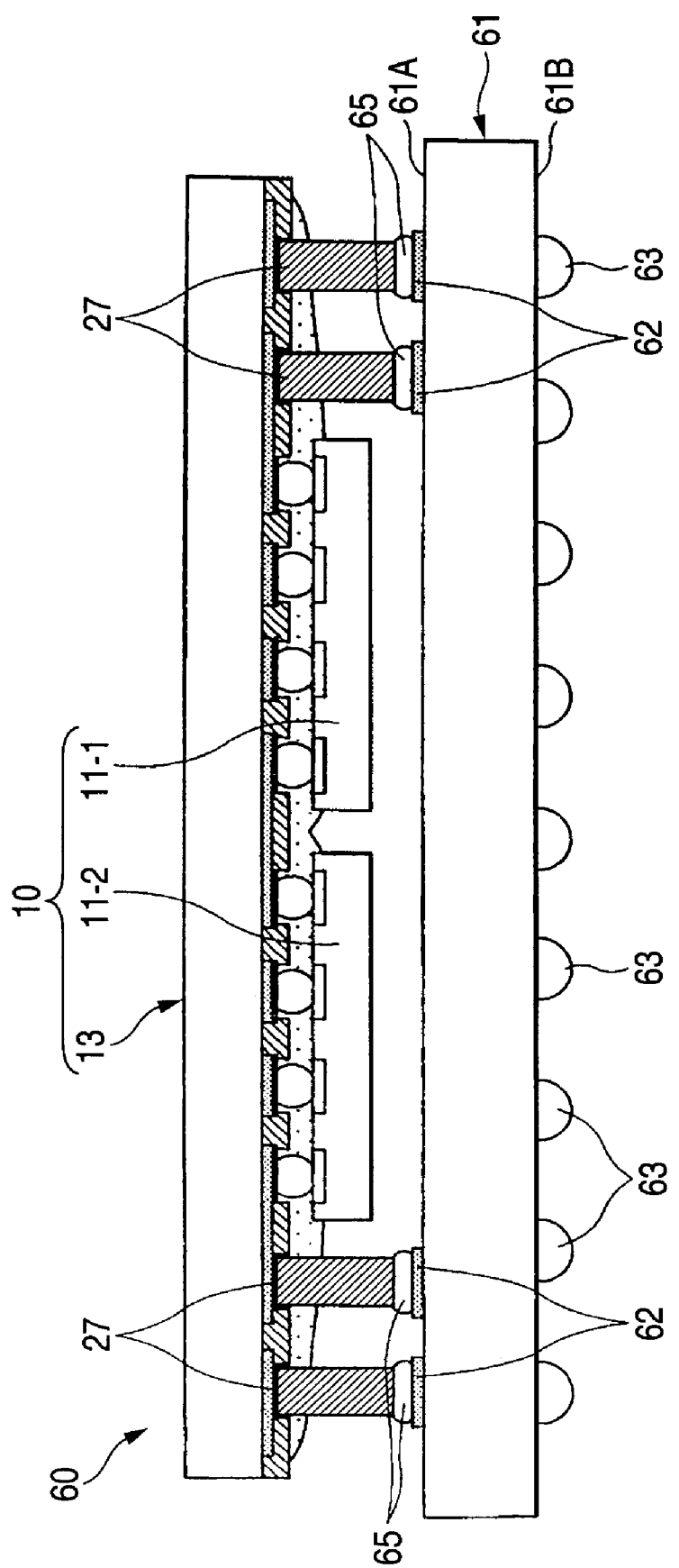
FIG. 16 is a sectional view of an electronic apparatus comprising a semiconductor device of the embodiment.

FIG. 16 is a sectional view of an electronic apparatus comprising a semiconductor device of the embodiment. In FIG. 16, the same numerals are assigned to the same components as those of the semiconductor device 10 described above.

Referring to FIG. 16, an electronic apparatus 60 has a semiconductor device 10 and a mounting substrate 61. The mounting substrate 61 has connection pads 62 (first connection pads) and external connection terminals 63.

The connection pads 62 are disposed on an upper surface 61A of the mounting substrate 61 and are placed as opposed to external connection terminals 27 of the semiconductor device 10. The connection pads 62 are electrically connected to the external connection terminals 27 of the semiconductor device 10 through solder 65. Also, the connection pads 62 are electrically connected to the external connection terminals 63 by a wiring pattern (not shown). As the mounting substrate 61, for example, a motherboard can be used.

According to the electronic apparatus of the embodiment, by disposing the connection pads 62 on the upper surface 61A of the mounting substrate 61 as opposed to the external connection terminals 27 of the semiconductor device 10, the connection pads 62 are placed inside the mounting substrate 61 than ever before and a size (area) of the mounting substrate 61 is decreased and the electronic apparatus 60 can be miniaturized.

Also, by connecting the external connection terminals 27 of the semiconductor device 10 to the connection pads 62 of the mounting substrate 61 through the solder 65, the need for the sealing resin 115 which was required in the related-art electronic apparatus 100 for making wire bonding connection between the semiconductor device 101 and the mounting substrate 102 is eliminated, so that manufacturing cost of the electronic apparatus 60 can be reduced and also a height of the electronic apparatus 60 can be decreased.

In addition, in FIG. 16, the electronic apparatus 60 comprising the semiconductor device 10 and the mounting substrate 61 has been described as an example, but effect similar to that of the electronic apparatus 60 can also be obtained in an electronic apparatus in which a semiconductor 45 is disposed instead of the semiconductor device 10.

(Second Embodiment)

Figure 17:
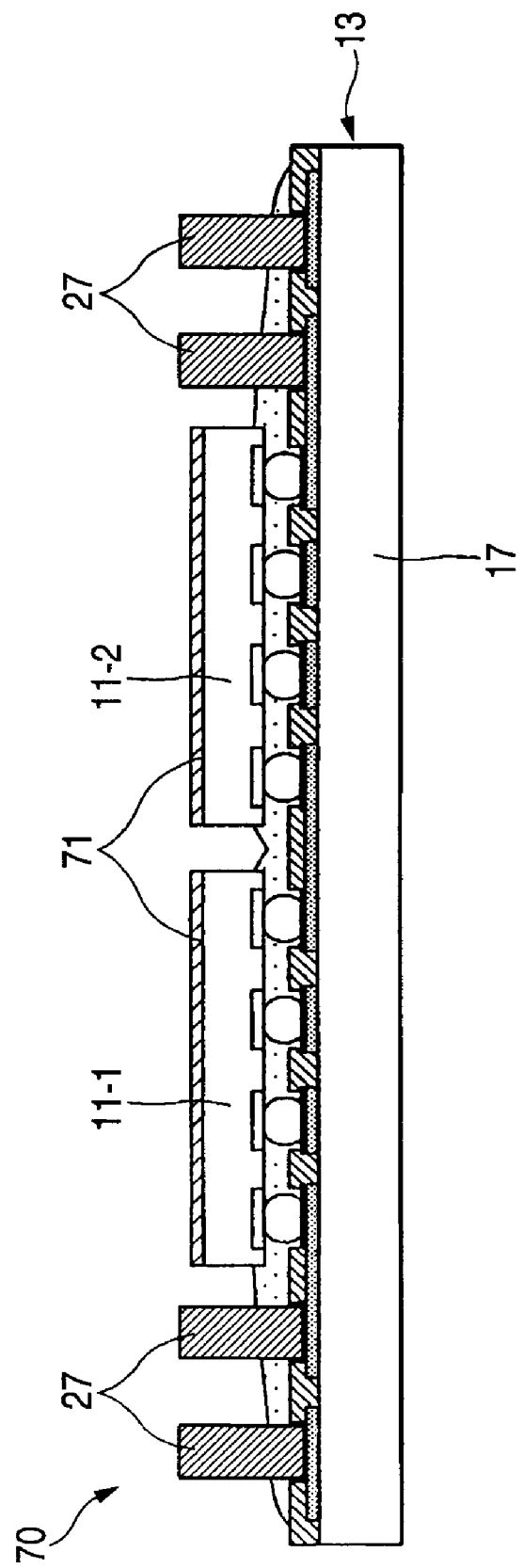
FIG. 17 is a sectional view of a semiconductor device according to a second embodiment of the invention.

FIG. 17 is a sectional view of a semiconductor device according to a second embodiment of the invention. In FIG. 17, the same numerals are assigned to the same components as those of the semiconductor device 10 described in the first embodiment.

Referring to FIG. 17, a semiconductor device 70 is configured in a manner similar to the semiconductor device 10 described above except that metal layers 71 are disposed on semiconductor chips 11-1, 11-2, 12-1, 12-2. The metal layers 71 are disposed on surfaces of the semiconductor chips 11-1, 11-2, 12-1, 12-2 opposite to the side connected to a substrate 13. As the metal layers 71, for example, a Ti/Au laminated film in which a Ti film and an Au film are sequentially laminated can be used. In addition, effect similar to that of the semiconductor device 10 of the first embodiment can also be obtained in the semiconductor device 70 of the present embodiment.

Figure 18:
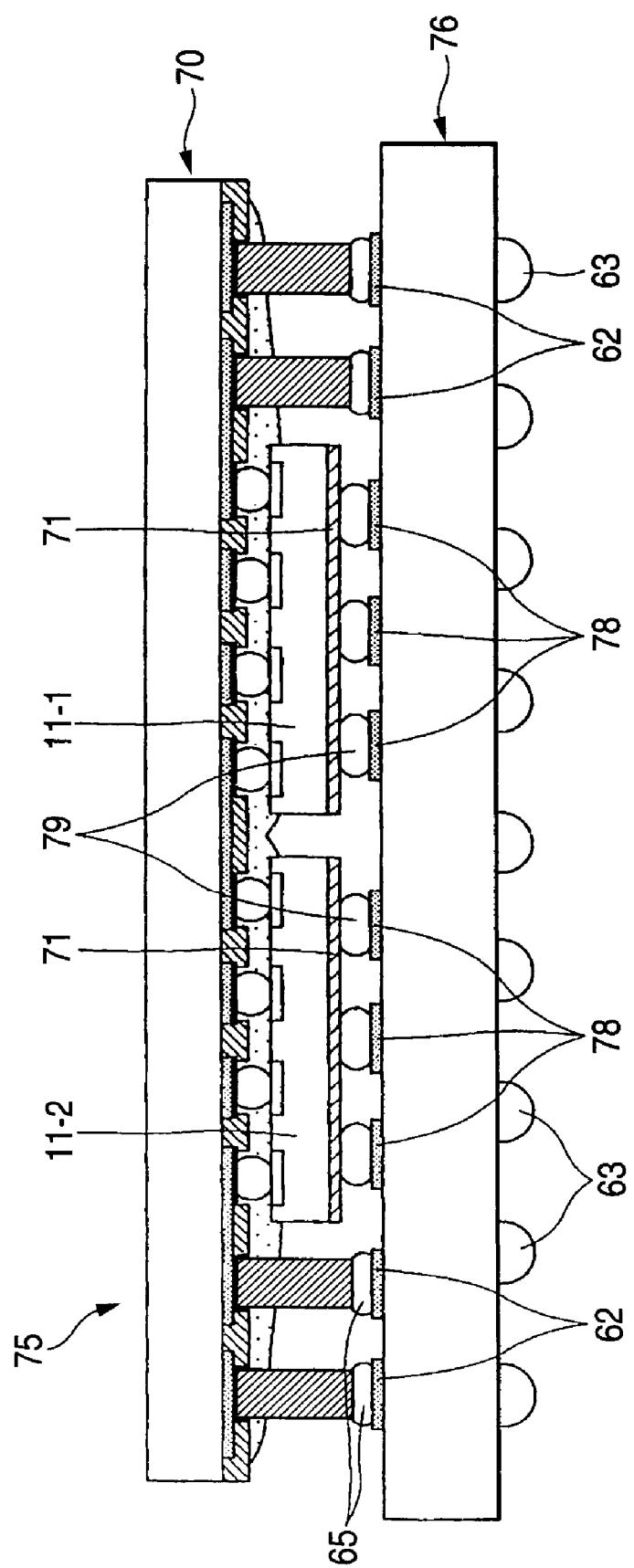
FIG. 18 is a sectional view of an electronic apparatus comprising a semiconductor device of the embodiment.
Figure 19:
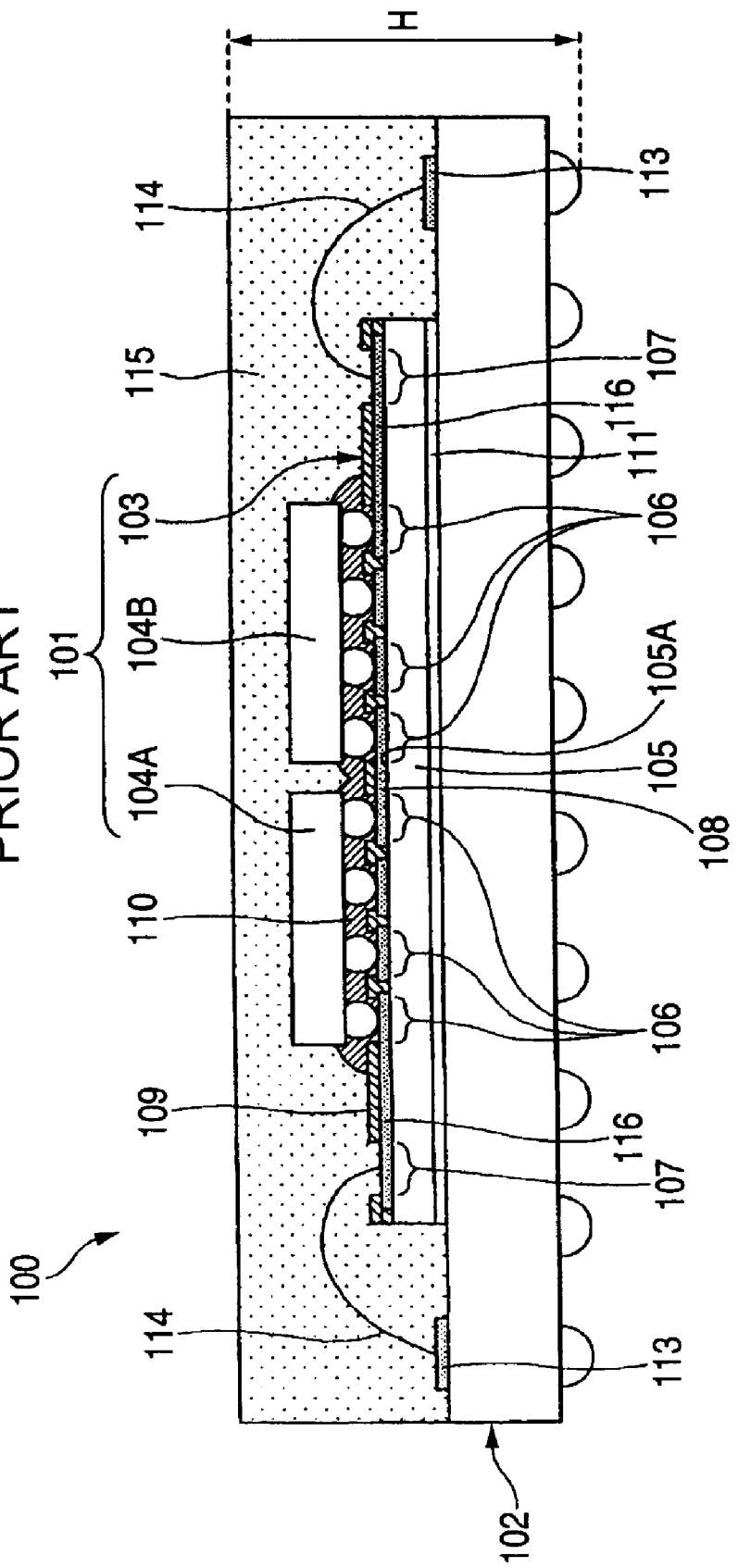
FIG. 19 is a sectional view of an electronic apparatus comprising a semiconductor device in which plural semiconductor chips with different functions are closely connected on the same substrate.

FIG. 18 is a sectional view of an electronic apparatus comprising a semiconductor device of the embodiment. In FIG. 18, the same numerals are assigned to the same components as those of the electronic apparatus 60 described in the first embodiment.

Referring to FIG. 18, an electronic apparatus 75 has a semiconductor device 70 and a mounting substrate 76. The mounting substrate 76 is configured in a manner similar to the mounting substrate 61 described in the first embodiment except that connection pads 78 (second connection pads) are further disposed. The connection pads 78 are placed as opposed to the metal layers 71 disposed on the semiconductor chips 11-1, 11-2, 12-1, 12-2. The connection pads 78 are electrically connected to the metal layers 71 through solder 79.

According to the electronic apparatus of the embodiment, by disposing the connection pads 78 on the mounting substrate 76 and electrically connecting the connection pads 78 to the metal layers 71 disposed on the semiconductor chips 11-1, 11-2, 12-1, 12-2 through the solder 79, heat generated in the semiconductor chips 11-1, 11-2, 12-1, 12-2 can be radiated efficiently. Also, in the electronic apparatus of the embodiment, similar effect can also be obtained using a semiconductor device in which the metal layers 71 are disposed on the semiconductor chips 11-1, 11-2, 12-1, 12-2 of the semiconductor device 45 described in FIG. 10 instead of the semiconductor device 70. In addition, effect similar to that of the electronic apparatus 60 described in the first embodiment can also be obtained in the electronic apparatus 75 of the embodiment.

The preferred embodiments of the invention have been described above in detail, but the invention is not limited to such specific embodiments, and various modifications and changes can be made within the gist of the invention described in the claims.

The invention can be applied to a semiconductor device and an electronic apparatus capable of achieving miniaturization and improving reliability of electrical connection between the semiconductor device and a mounting substrate.

What is claimed is:

1. A semiconductor device comprising:
a plurality of semiconductor chips; and
a substrate having an external connection terminal electrically connected to said plurality of semiconductor chips, the external connection terminal having a connection portion,
wherein the external connection terminal is disposed on a side of the substrate to which the plurality of semiconductor chips are connected such that the external connection terminal is spaced from the semiconductor chips along the substrate so as to be disposed between the semiconductor chips and a peripheral edge of the substrate, and wherein the external connection terminal protrudes beyond said plurality of semiconductor chips, wherein an under fill resin is disposed between the plurality of semiconductor chips and the substrate, the under fill resin extending from the semiconductor chips to an under fill resin peripheral end disposed beyond the external connection terminal such that the under fill resin peripheral end is disposed between the external connection terminal and the peripheral edge of the substrate, wherein a covered part of the external connection terminal is covered with the under fill resin, and wherein an exposed part of the external connection terminal projects from the under fill resin so as to be exposed from the under fill resin, wherein the exposed part of the external connection terminal includes the connection portion of the external connection terminal, wherein each of the plurality of semiconductor chips includes a first chip surface, which is opposite a second chip surface that is mounted on the substrate, that is exposed from the under fill resin, wherein the under fill resin peripheral end is positioned such that a portion of the side of the substrate to which the plurality of semiconductor chips are connected between the external connection terminal and the peripheral edge of the substrate is exposed through the under fill resin.

2. An electronic apparatus comprising:

a semiconductor device comprising:

a plurality of semiconductor chips;

a substrate having an external connection terminal electrically connected to said plurality of semiconductor chips, the external connection terminal having a connection portion; and a mounting substrate having a first connection pad opposed to the external connection terminal, wherein the external connection terminal is disposed on a side of the substrate to which the plurality of semiconductor chips are connected such that the external connection terminal is spaced from the semiconductor chips along with the substrate so as to be disposed between the semiconductor chips and a peripheral edge of the substrate, and wherein the external connection terminal protrudes beyond said plurality of semiconductor chips, wherein flip chip connection is made between the plurality of semiconductor chips and the substrate on the side of the substrate that the external connection terminal is disposed, wherein an under fill resin is disposed between the plurality of semiconductor chips and the substrate, the under fill resin extending from the semiconductor chips to an under fill resin peripheral end disposed beyond the external connection terminal such that the under fill resin peripheral end is disposed between the external connection terminal and the peripheral edge of the substrate, wherein a covered part of the external connection terminal is covered with the under fill resin and an exposed part of the external connection terminal projects from the under fill resin so as to be exposed from the under fill resin, whereby the exposed part of the external connection terminal includes the connection portion of the external connection terminal, wherein each of the plurality of semiconductor chips includes a first chip surface, which is opposite a second chip surface that is mounted on the substrate, that is exposed from the under fill resin, wherein the external connection terminal is electrically connected to the first connection pad, wherein the under fill resin peripheral end is positioned such that a portion of the side of the substrate to which the plurality of semiconductor chips are connected between the external connection terminal and the peripheral edge of the substrate is exposed through the under fill resin.

* * * * *